United States Patent [19]
Yasuda

[11] Patent Number: 6,091,748
[45] Date of Patent: Jul. 18, 2000

[54] SEMICONDUCTOR LASER DRIVE CIRCUIT AND LIGHT BEAM SCANNING SYSTEM USING SEMICONDUCTOR LASER

[75] Inventor: Hiroaki Yasuda, Kanagawa-ken, Japan

[73] Assignee: Fuji Photo Film Co., Ltd., Kanagawa, Japan

[21] Appl. No.: 08/992,715

[22] Filed: Dec. 17, 1997

[30] Foreign Application Priority Data

Dec. 18, 1996 [JP] Japan .................................. 8-338092

[51] Int. Cl.[7] .......................................... H01S 3/00
[52] U.S. Cl. ............................................... 372/38
[58] Field of Search ........................................ 372/38, 29

[56] References Cited

U.S. PATENT DOCUMENTS 5,276,697 1/1994 Davis ......................................... 372/38
5,530,261 6/1996 Yasuda ..................................... 250/588

FOREIGN PATENT DOCUMENTS 64-79695 3/1989 Japan ............................ G21C 17/10
1-136630 5/1989 Japan ................................ A61B 5/00
7-59783 3/1995 Japan ............................. A61B 10/00

*Primary Examiner*—Rodney Bovernick
*Assistant Examiner*—Michael J. Stahl
*Attorney, Agent, or Firm*—Sughrue, Mion, Zinn, Macpeak & Seas, PLLC

[57] ABSTRACT

A semiconductor laser drive circuit for supplying an electric current to a semiconductor laser includes a laser power supply which supplies an electric current of a positive or negative voltage to the semiconductor laser, an operational amplifier which is driven by a positive amplifier power supply and a negative amplifier power supply, and a current control element which controls the amount of electric current flowing into the semiconductor laser according to the output of the operational amplifier. A sequence circuit causes one of the amplifier power supplies, which one is reverse in polarity as the laser power supply, to start first and then causes the other amplifier power supply to start after the former amplifier power supply achieves a steady voltage.

2 Claims, 3 Drawing Sheets

SEMICONDUCTOR LASER DRIVE CIRCUIT AND LIGHT BEAM SCANNING SYSTEM USING SEMICONDUCTOR LASER

BACKGROUND OF THE INVENTION

1 Field of the Invention

This invention relates to a semiconductor laser drive circuit for supplying an electric current to a semiconductor laser, and more particularly to such a semiconductor laser drive circuit which is improved in the method of driving the semiconductor laser upon turning on the power source. This invention further relates to a light beam scanning system using a semiconductor laser.

2. Description of the Related Art

As is well known, a semiconductor laser has been in wide use as a read-out light source of a pickup for a compact disc player, a mini-disc player or the like or a stimulating light source for a radiation image read-out apparatus using a stimulable phosphor sheet or a fluorescence diagnosis apparatus or the like. As disclosed, for instance, in Japanese Unexamined Patent Publication No. 1(1989)-79695 and U.S. Pat. No. 5,530,261, the radiation image read-out apparatus using a stimulable phosphor sheet is a kind of medical image readout apparatus in which a stimulable phosphor sheet is used as a recording medium for recording a radiation image. That is, the stimulable phosphor sheet is provided with a layer of stimulable phosphor which, when exposed to a radiation such as X-rays, α-rays, β-rays, γ-rays, cathode rays or ultraviolet rays, stores a part of the energy of the radiation, and emits light in proportion to the stored energy of the radiation when exposed to stimulating light such as visible light, laser beam or the like. The stimulable phosphor sheet is exposed to radiation passing through an object and then exposed to a stimulating light to emit light in proportion to the stored radiation energy. The light emitted from the stimulable phosphor sheet is detected and converted to an electric image signal, on the basis of which a radiation image is reproduced. As disclosed, for instance, in Japanese Unexamined Patent Publication Nos. 1(1989)-136630 and 7(1995)-59783, the fluorescence diagnosis apparatus is a kind of medical image read-out apparatus in which a photosensitive material which has affinity to tumor and generates fluorescence upon stimulation by stimulating light having a certain wavelength is given to tumor and the tumor is exposed to stimulating light. Then an image formed by the fluorescence is used in diagnosis.

A semiconductor laser has been increasingly used as a light source for those systems in place of a vacuum tube type laser due to its compactness, inexpensiveness and easiness to handle.

However since the semiconductor laser is broken by an excess current, the electric current supplied to the semiconductor laser must be controlled not to exceed a maximum allowable current, for instance, by constant-current control. Even a momentary excess current, which can generated upon starting the semiconductor laser, especially upon turning on the power supply, should be prevented.

Conventionally the semiconductor laser is protected from a transient excess current upon turning on the power supply by providing the power supply circuit with a slow start circuit so that the supply voltage is gradually increased.

In the method of protecting the semiconductor laser from a transient excess current upon turning on the power supply by providing the power supply circuit with a slow start circuit, the starting time of the power supply circuit is controlled by use of charging properties of an integrating circuit formed by a resistor and an electrolytic capacitor. On the other hand, a conventional semiconductor laser drive circuit is provided with a control circuit such as an automatic current control circuit or an automatic power control circuit to prevent an excess current from being supplied to the semiconductor laser even in a steady state. As shown in FIG. 4, the automatic current control circuit uses an operational amplifier 24 as a control amplifier. A current control element 12 such as a transistor or a field effect transistor and a current detecting resistor 14 are connected in series with a semiconductor laser 10 so that an amount of current flowing through the semiconductor laser 10 is detected through the voltage across the resistor 14, and the detected voltage is input into an inverted input terminal (−) of the control amplifier 24 while a predetermined reference voltage is input into a non-inverted input terminal (+) of the control amplifier 24. The output of the control amplifier 24 is input into a control input terminal of the current control element 12. Thus a negative feedback circuit for controlling the current supplied to the semiconductor laser 10 to a predetermined value not larger than the maximum allowable current is formed. The automatic power control circuit is basically the same in structure as the automatic current control circuit as shown in FIG. 5 and differs from the automatic current control circuit in that the light output of the semiconductor laser 10 is detected by a photodetector 11 such as a photodiode and the current supplied to the semiconductor laser 10 is controlled so that the light output is controlled to a predetermined value not larger than the maximum allowable level.

Conventionally in such control circuits, the positive and negative power supplies of the operational amplifier are turned on substantially simultaneously. Accordingly even if the starting time of the power supply for the semiconductor laser is controlled by the slow start circuit, an excess current can transiently flow into the semiconductor laser depending on the starting state of the operational amplifier. This is because the negative feedback circuit including the operational amplifier behaves upon starting the power supply for the operational amplifier in a manner different from that of the steady state. This problem can be overcome by inserting an integrating circuit formed by a resistor and an electrolytic capacitor between the output of the operational amplifier and the control input terminal of the current control element so that current start of the current control element is delayed.

However even if such an integrating circuit is used, it is difficult to prevent an excess current from flowing into the semiconductor laser during a transient period from initiation of starting to the time the steady state is achieved. Further when the power supply is repeatedly turned on and off, it is very difficult to control the charging/discharging properties of the integrating circuit formed by a resistor and an electrolytic capacitor to prevent an excess current from flowing into the semiconductor laser.

SUMMARY OF THE INVENTION

In view of the foregoing observations and description, the primary object of the present invention is to provide a semiconductor laser drive circuit for supplying an electric current to a semiconductor laser which can prevent an excess current from flowing into the semiconductor laser upon turning on the power supply, thereby protecting the semiconductor laser from breakage.

Another object of the present invention is to provide a light beam scanning system having a laser driven by the aforesaid drive circuit in accordance with the present invention.

The semiconductor laser drive circuit for supplying an electric current to a semiconductor laser in accordance with the present invention comprises a laser power supply which supplies an electric current of a positive or negative voltage to the semiconductor laser, an operational amplifier which is driven by a positive amplifier power supply and a negative amplifier power supply, and a current control element which controls the amount of electric current flowing into the semiconductor laser according to the output of the operational amplifier, wherein the improvement comprises a sequence circuit which causes one of the amplifier power supplies, which one is reverse in polarity as the laser power supply, to start first and then causes the other amplifier power supply to start after said one of the amplifier power supplies achieves a steady voltage.

That is, in the semiconductor laser drive circuit of the present invention, the slow start circuit of the laser power supply which has been used from before and the amplifier power supplies are separately started. Especially by driving the operational amplifier by positive and negative power supplies and controlling the order of starting the power supplies, an excess current is prevented from flowing into the current control element or the semiconductor laser upon start of the operational amplifier.

The light beam scanning system of the present invention is characterized by having a laser driven by a drive circuit described above.

In the semiconductor laser drive circuit of the present invention, since one of the power supplies for the operational amplifier is started with the output of the operational amplifier cutting off the current control element, no current flows into the semiconductor laser until the voltage of said one of the power supplies for the operational amplifier reaches a steady value even if the laser power supply has been started. Further during a transient period where the other amplifier power supply is started, the steady state is gradually achieved and accordingly an excess current cannot flow into the semiconductor laser. Further if the laser power supply has been started, an excess current cannot flow into the semiconductor laser so long as the operational amplifier is started in the manner described above.

Thus the problem that an excess current flows into the semiconductor laser upon turning on the power supply can be overcome and there is no fear that the semiconductor laser is broken upon turning on the power supply.

When a laser provided with such a semiconductor laser drive circuit is employed in a light beam scanning system for a radiation image read-out apparatus or the like, the reliability of the apparatus can be improved.

DESCRIPTION OF THE PREFERRED EMBODIMENTS

Figure 1:
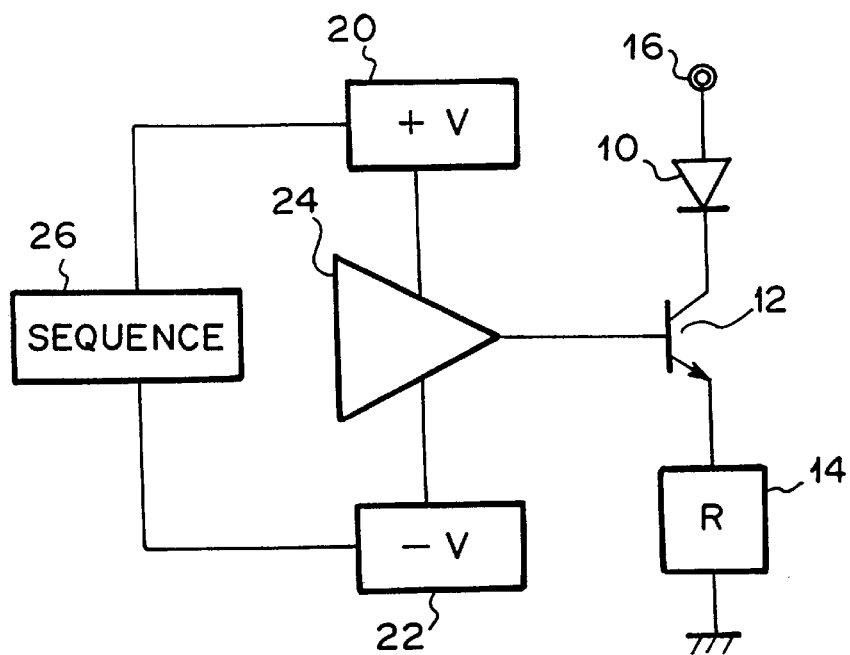
FIG. 1 is a schematic diagram of a semiconductor laser drive circuit in accordance with a first embodiment of the present invention.

In FIG. 1, a laser power supply 16 is connected to the anode of a semiconductor laser 10 and the cathode of the semiconductor laser 10 is connected to the collector of a NPN transistor 12. The emitter of the transistor 12 is grounded through a resistor 14. The base of the transistor 12 is connected to the output of an operational amplifier 24, which is driven by a positive power supply 20 and a negative power supply 22. A sequence circuit 26 is connected to the positive and negative power supplies 20 and 22.

The laser power supply 16 is of a positive voltage and supplies an electric current to the semiconductor laser 10. The transistor 12 functions as a current control element which controls the amount of electric current supplied to the semiconductor laser 10. The base of the transistor 12 is connected to the output of the operational amplifier 24 as described above and the current value to the semiconductor laser 10 and the transistor 12 in the steady state is set by a constant-current control loop (not shown) formed by the operational amplifier 24.

The sequence circuit 26 controls the order in which the positive power supply 20 and the negative power supply 22 are turned on. That is, the sequence circuit 26 causes the negative power supply 22 to start first and does not cause the positive power supply to start 20 until the voltage of the negative power supply 22 reaches a steady value. At this time, the output of the operational amplifier 24 is between 0 and the voltage of the negative power supply 22. Accordingly the base of the transistor 12 is in a state of reverse bias and the transistor 12 is in a cut-off state. That is, no current flows through the transistor 12 and no current is supplied to the semiconductor laser 10 even if the laser power supply 16 has been started. Then when the voltage of the negative power supply 22 reaches the steady value, the positive power supply 20 is started and the voltage of the positive power supply 20 gradually reaches the steady value. At this time, the output of the operational amplifier 24 begins to function as a constant-current control loop and tends to control the value of the electric current to the semiconductor laser 10 to a steady state value. In a transient period before the voltage of the positive power supply 20 reaches the steady value, the voltage of the positive power supply 20 is low and the current to the semiconductor laser 10 is not larger than the steady state value. Accordingly an excess current cannot flow into the semiconductor laser 10.

Thus, in the semiconductor laser drive circuit of this embodiment, an excess current cannot flow into the semiconductor laser 10 even during a transient period just after the power supply is started, whereby fear of breaking the semiconductor laser 10 can be avoided. The laser power supply 16 and the positive power supply 20 may be the same.

Figure 2:
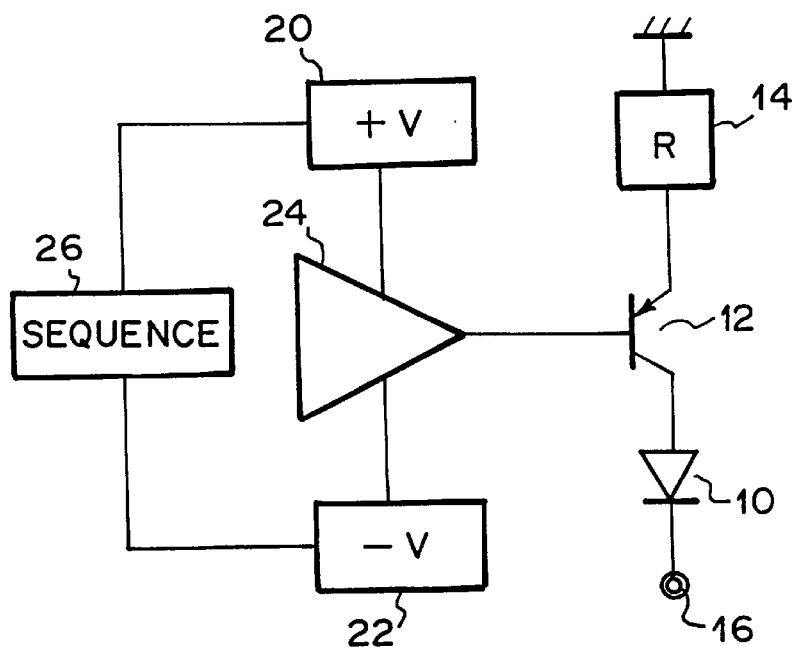
FIG. 2 is a schematic diagram of a semiconductor laser drive circuit in accordance with a second embodiment of the present invention.

A semiconductor laser drive circuit in accordance with a second embodiment of the present invention will be described with reference to FIG. 2, hereinbelow. In FIG. 2, the elements analogous to those in FIG. 1 are given the same reference numerals and will not be described here.

In FIG. 2, a laser power supply 16 is connected to the cathode of a semiconductor laser 10 and the anode of the semiconductor laser 10 is connected to the collector of a PNP transistor 12. The emitter of the transistor 12 is grounded through a resistor 14. The base of the transistor 12 is connected to the output of an operational amplifier 24, which is driven by a positive power supply 20 and a negative power supply 22. A sequence circuit 26 is connected to the positive and negative power supplies 20 and 22. The laser power supply 16 is of a negative voltage and supplies an electric current to the semiconductor laser 10.

The sequence circuit 26 causes the positive power supply 20 to start first and does not cause the negative power supply 22 to start until the voltage of the positive power supply 20 reaches a steady value. At this time, the output of the operational amplifier 24 is between 0 and the voltage of the positive power supply 20. Accordingly the base of the transistor 12 is in a state of reverse bias and the transistor 12 is in a cut-off state. That is, no current flows through the transistor 12 and no current is supplied to the semiconductor laser 10 even if the laser power supply 16 has been started. Then when the voltage of the positive power supply 20 reaches the steady value, the negative power supply 22 is started and the voltage of the negative power supply 22 gradually reaches the steady value. At this time, the output of the operational amplifier 24 begins to function as a constant-current control loop and tends to control the value of the electric current to the semiconductor laser 10 to a steady state value. In a transient period before the voltage of the negative power supply 22 reaches the steady value, the voltage of the negative power supply 22 is low and the current to the semiconductor laser 10 is not larger than the steady state value. Accordingly an excess current cannot flow into the semiconductor laser 10.

Thus, in the semiconductor laser drive circuit of this embodiment, an excess current cannot flow into the semiconductor laser 10 even a transient period just after the power supply is started, whereby fear of breaking the semiconductor laser 10 can be avoided. The laser power supply 16 and the negative power supply 22 may be the same.

The semiconductor laser drive circuit of the present invention need not be limited to the embodiments described above but may be variously modified. For example, the semiconductor laser 10 may be connected to the emitter of the transistor 12. Though, in the embodiments described above, a transistor is used as a current control element, a FET may be employed in place of the transistor. That is, the NPN transistor may be substituted for a N-channel FET and the PNP transistor may be substituted for a P-channel FET. When a FET is employed in place of the transistor, the base, the collector and the emitter in the above description should be reread respectively as the gate, the drain and the source.

Figure 3:
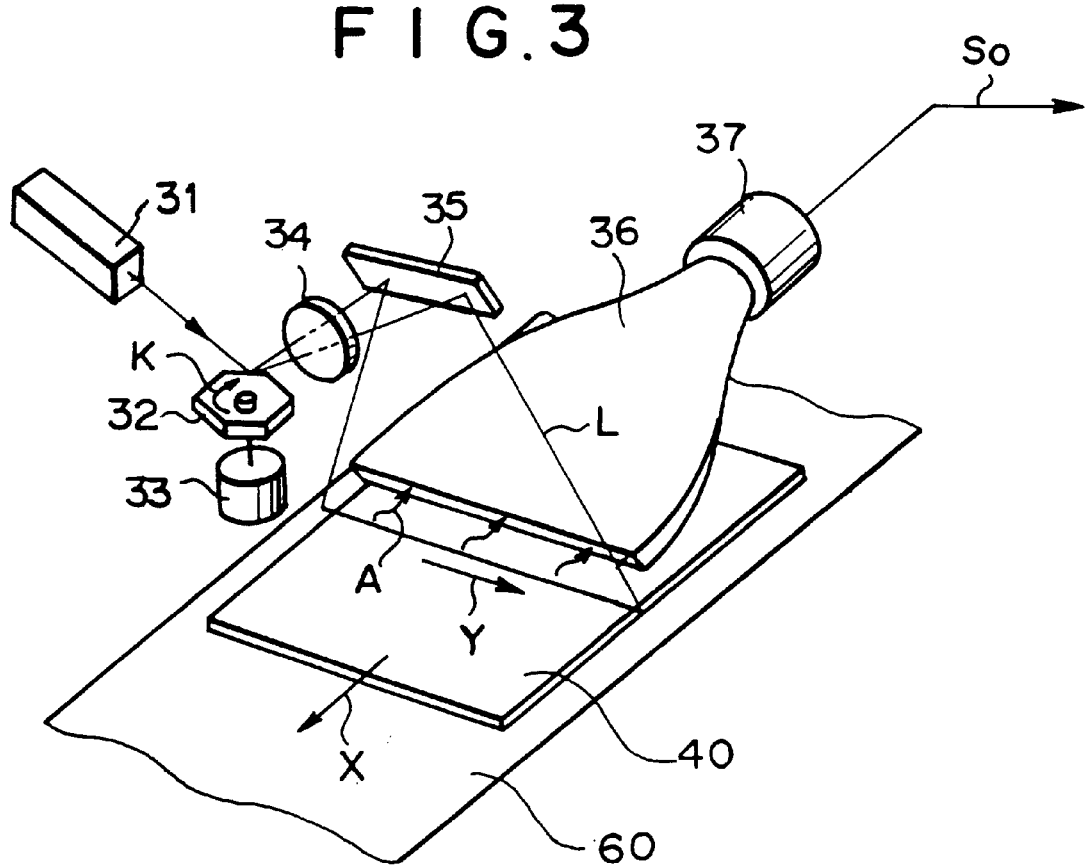
FIG. 3 is a schematic view of a light beam scanning system provided with a laser driven by a semiconductor laser drive circuit in accordance with the present invention.
Figure 4:
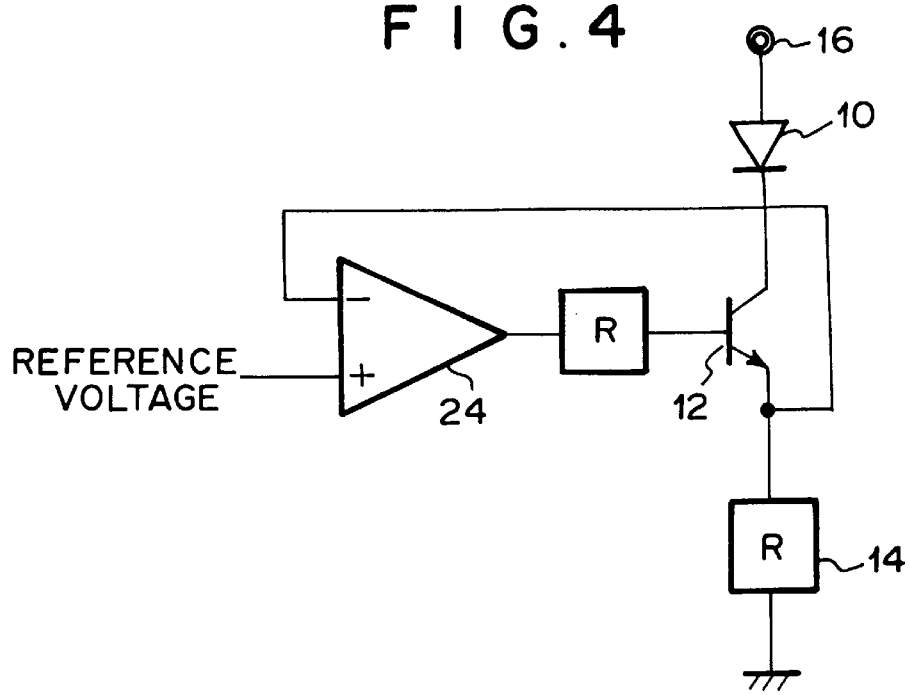
FIG. 4 is a circuit diagram of an example of an automatic current control circuit.
Figure 5:
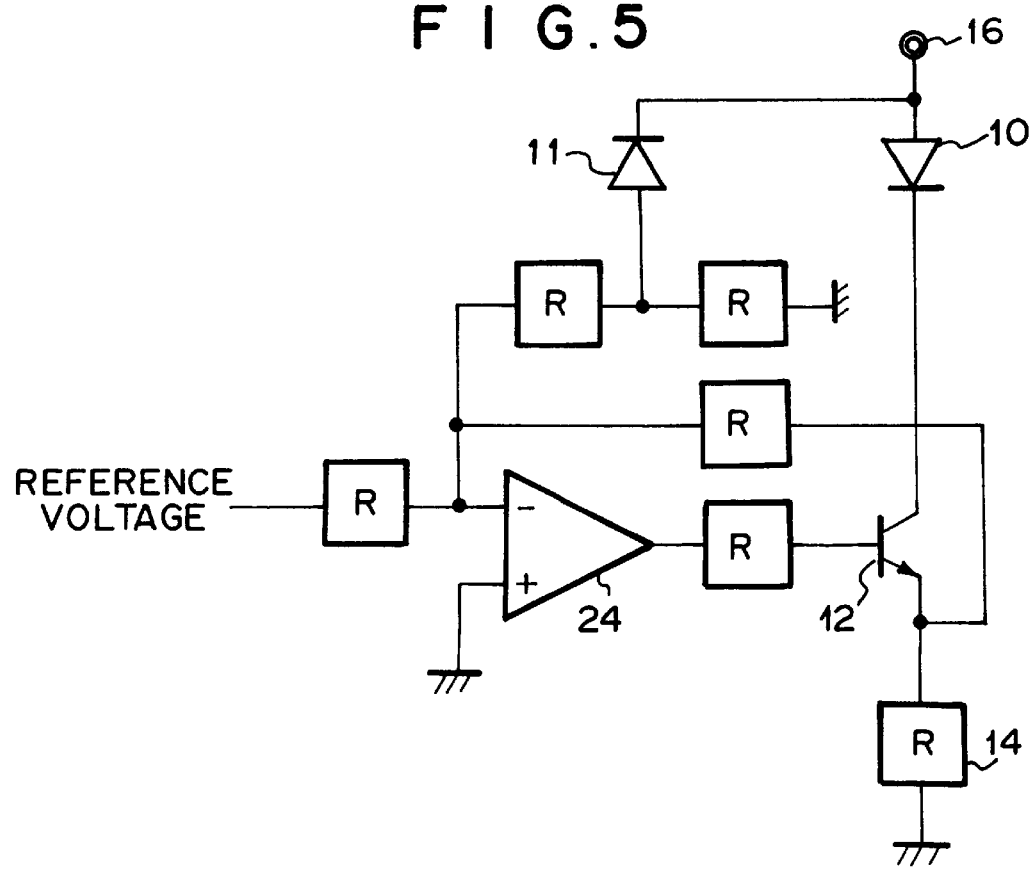
FIG. 5 is a circuit diagram of an example of an automatic power control circuit.

A semiconductor laser driven by the drive circuit of the present invention is useful for, for instance, a radiation image read-out apparatus such as disclosed in U.S. Pat. No. 5,530,261. An example of an image read-out section of such a radiation image read-out apparatus will be briefly described with reference to FIG. 3, hereinbelow. As shown in FIG. 3, the image read-out section is provided with a light beam scanning system having a laser 31 driven by the drive circuit of the present invention.

That is, the light beam scanning system comprises a laser 31, which is driven by the drive circuit of the present invention and emits a laser beam L of a predetermined wavelength, a rotating polygonal mirror 32 which deflects the laser beam L, a motor 33 which drives the rotating polygonal mirror 32, an fθ lens 34 which condenses the laser beam L and a reflecting optical system 35 which reflects the condensed laser beam L to impinge upon a stimulable phosphor sheet 40. When exposed to the laser beam L, the stimulable phosphor sheet 40 emits light A in proportion to the radiation energy stored thereon. The light A emitted by the stimulable phosphor sheet 40 is guided to a photomultiplier 37 by an optical guide 36 and the photomultiplier 37 converts the light A to an electric image signal representing a radiation image stored on the stimulable phosphor sheet 40.

The stimulable phosphor sheet 40 is placed on a conveyor means 60 and is conveyed in the direction of arrow X to the image read-out section. In the image read-out section, the laser beam L emitted from the laser 31 is deflected by the rotating polygonal mirror 32 which is rotated in the direction of arrow K at a high speed by the motor 33. The deflected laser beam L is condensed by the fθ lens 34 and is reflected by the reflecting optical system 35 to impinge upon the stimulable phosphor sheet 40. Due to rotation of the polygonal mirror 32 in the direction of arrow K, the laser beam L scans the stimulable phosphor sheet 40 in the direction of arrow Y (main scanning) while the stimulable phosphor sheet 40 is conveyed in the direction of arrow X (sub-scanning), whereby the laser beam L two-dimensionally scans the stimulable phosphor sheet 40.

When exposed to the laser beam L, the stimulable phosphor sheet 40 emits light A in proportion to the radiation energy stored thereon. The light A emitted by the stimulable phosphor sheet 40 is guided to a photomultiplier 37 by an optical guide 36 and the photomultiplier 37 amplifies the light A and converts it to an electric image signal So representing a radiation image stored on the stimulable phosphor sheet 40.

What is claimed is:

1. A semiconductor laser drive circuit for supplying an electric current to a semiconductor laser comprising
    a laser power supply which supplies an electric current of a positive or negative voltage to the semiconductor laser,
    an operational amplifier which is driven by a positive amplifier power supply and a negative amplifier power supply,
    a current control element which controls the amount of electric current flowing into the semiconductor laser according to the output of the operational amplifier, and
    a sequence circuit which causes one of the amplifier power supplies, which is reverse in polarity to the laser power supply, to start first and then causes the other amplifier power supply to start after said one of the amplifier power supplies achieves a steady voltage.

2. A light beam scanning system comprising a laser driven by a semiconductor laser drive circuit, the semiconductor laser drive circuit comprising
    a laser power supply which supplies an electric current of a positive or negative voltage to the semiconductor laser,
    an operational amplifier which is driven by a positive amplifier power supply and a negative amplifier power supply,
    a current control element which controls the amount of electric current flowing into the semiconductor laser according to the output of the operational amplifier, and
    a sequence circuit which causes one of the amplifier power supplies, which is reverse in polarity to the laser power supply, to start first and then causes the other amplifier power supply to start after said one of the amplifier power supplies achieves a steady voltage.

* * * * *